United States Patent
Kim

(10) Patent No.: US 7,737,499 B2
(45) Date of Patent: Jun. 15, 2010

(54) SRAM DEVICE HAVING A COMMON CONTACT

(75) Inventor: Dae Kyeun Kim, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 404 days.

(21) Appl. No.: 11/616,276

(22) Filed: Dec. 26, 2006

(65) Prior Publication Data
US 2007/0164368 A1    Jul. 19, 2007

(30) Foreign Application Priority Data
Dec. 29, 2005    (KR) ................... 10-2005-0133288

(51) Int. Cl.
*H01L 27/01* (2006.01)
*H01L 29/76* (2006.01)
(52) U.S. Cl. .............. 257/350; 257/369; 257/371; 257/903
(58) Field of Classification Search .......... 257/350, 257/269, 369, 371, 903, 904, E21.661, E27.098, 257/E27.099, E27.1, E27.101
See application file for complete search history.

(56) References Cited

U.S. PATENT DOCUMENTS 6,765,272 B2 * 7/2004 Natsume ................ 257/393
7,061,128 B2 * 6/2006 Maki ..................... 257/401

* cited by examiner

*Primary Examiner*—Hung Vu
(74) *Attorney, Agent, or Firm*—Sherr & Vaughn, PLLC

(57) ABSTRACT

Embodiments relate to a SRAM, in which a well isolation method may be applied so that an N-well and a P-well are separated from each other and that well walls of opposite conductive types are formed on facing sides. Also, the active regions of NMOS and PMOS may be connected to each other and the contacts of a PMOS drain and an NMOS source may be united to one so that the contacts are moved to the active regions of wide parts. A size of the common contact may be one to two times the size of a contact defined by a design rule. The active region may have a round bent part. The common contacts are arranged to be asymmetrical with each other. Therefore, it may be possible to secure the process margins of the active regions and the contacts, to improve a leakage current characteristic, and to improve yield. Also, it may be possible to prevent the dislocation of the active region and to omit a conventional thermal treatment process so that it may be possible to simplify processes and to reduce manufacturing cost.

8 Claims, 5 Drawing Sheets

SRAM DEVICE HAVING A COMMON CONTACT

The present application claims priority under 35 U.S.C. 119 and 35 U.S.C. 365 to Korean Patent Application No. 10-2005-0133288 (filed on Dec. 29, 2005), which is hereby incorporated by reference in its entirety.

BACKGROUND

A SRAM device may be a semiconductor memory device. Information stored on an SRAM device may be left intact while power is supplied. Hence, it may not be necessary to periodically refresh the SRAM device. An integrity of the SRAM device may be smaller than the integrity of a DRAM device. However, power consumption may be lower and processing speed may be higher in the SRAM device. An SRAM cell may be composed of six transistors. These may include two pull down transistors, two pull up transistors, and two access transistors.

FIG. 1 is an example illustration of a cell layout of a related art SRAM device and FIG. 2 is an example sectional view taken along the line A-A of FIG. 1.

Referring to FIGS. 1 and 2, to form pull-down NMOS transistor 10a and pull-up PMOS transistor 10b, N-well 11a and P-well 11b may be formed on the silicon substrate. Active region 13 may be defined by device isolation layer 12 formed on a silicon substrate and a gate may be formed on the silicon substrate to cross active region 13. Source/drain 15a/15b may be formed in active regions 13 on both sides of gate 14. Source/drain 15a/15b and the gate may be connected to metal interconnection 17 thereon through contacts 16a, 16b, and 16c and silicide layers 18 may be formed on source/drain 15a/15b and gate 14.

In the SRAM cell having such a structure, a region in which contact 16b of PMOS drain 15b may be formed and a region in which contact 16a of NMOS source 15a may be vulnerable regions that may cause leakage current in relation with any read/memory operation of the SRAM device. However, the related art SRAM device may not be able to avoid lack of process margin that may be caused by the layout.

That is, as illustrated in FIG. 1, since contact 16b may be positioned at both ends of active region 13 in the case of PMOS 10b and contact 16a may be positioned in a bent part of active region 13 in the case of NMOS 10a, the margin of processes related to the active regions and the contacts may be lacking. In particular, in the case of NMOS 10a where contact 16a may be positioned in the bent part of active region 13, even when the contacts are slightly misaligned or when the size of the contacts are large, a leakage current characteristic of the SRAM device may be degraded.

Also, when contact 16a may be positioned in the bent part of active region 13, active region 13 may become sharp to secure a contact space. However, in this shape, stress may be concentrated and may affect the dislocation of active region 13. Hence, a sequential heat treatment process may be required.

Furthermore, although contact 16b of PMOS drain 15b and contact 16a of NMOS source 15a may be bound together through the metal interconnection as illustrated in FIG. 2, contact 16b and contact 16a are separated from each other using wide device isolation layer 12 to reduce the margin of the metal interconnection process, which can degrade the leakage current characteristic due to the alignment and size of the contacts.

SUMMARY

Embodiments relate to a method of manufacturing a semiconductor device. Embodiments relate to an SRAM device in which a cell layout may be changed to connect active regions of NMOS and PMOS to each other and to unite a contact of a PMOS drain and a contact of a NMOS source to one so that contact process margin is secured and that a leakage current characteristic is improved.

Embodiments relate to a SRAM device in which a SRAM cell layout may be changed by a well isolation method to secure contact process margin, to improve electrical characteristics such as leakage current and standby current and to improve the yield of the SRAM device.

Embodiments relate to a SRAM device in which sharp shapes of active regions may be improved to release the concentration of stress, which may prevent the dislocation of the active regions, and to omit a sequential heat treatment process so that it may be possible to simplify processes and to reduce manufacturing cost.

According to embodiments, a SRAM device may include an NMOS transistor and a PMOS transistor includes an N-well and a P-well formed in a silicon substrate, a device isolation layer formed in the silicon substrate in order to define an active region, a gate formed on the silicon substrate to cross the active region, source/drain formed in the active regions on both sides of the gate, and contacts connected to the source/drain and the gate. The active region of the NMOS and the active region of the PMOS are connected to each other and a drain of the PMOS and a source of the NMOS are connected to one common contact.

According to embodiments, an N-well and a P-well may be separated from each other by a prescribed distance. The N-well and the P-well may have well walls of opposite conductive types on facing sides.

According to embodiments, a size of the common contact may be one to two times the size of the contact defined by a design rule. The active region may have a round bent part. The common contacts may be arranged to be asymmetrical with each other.

Considering that the contacts of the pull-up PMOS and the pull-down NMOS may be bound together in the related art SRAM device, it may be possible to secure the process margins of the active regions and the contacts when the wide device isolation layers are removed and a well isolation method is used.

DETAILED DESCRIPTION OF EMBODIMENTS

Figure 1:
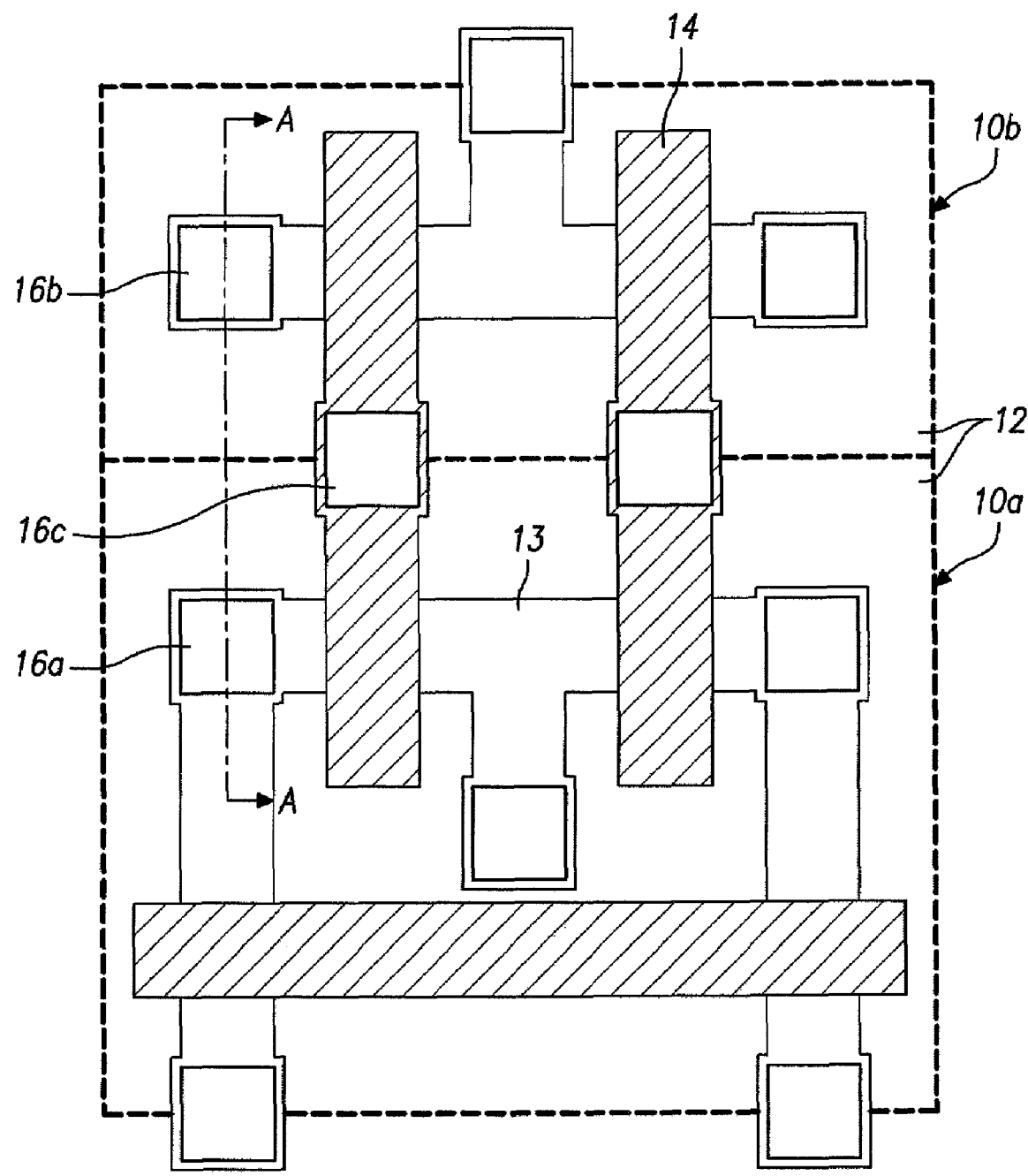
FIG. 1 is an example diagram illustrating a related art a cell layout of a SRAM device.
Figure 2:
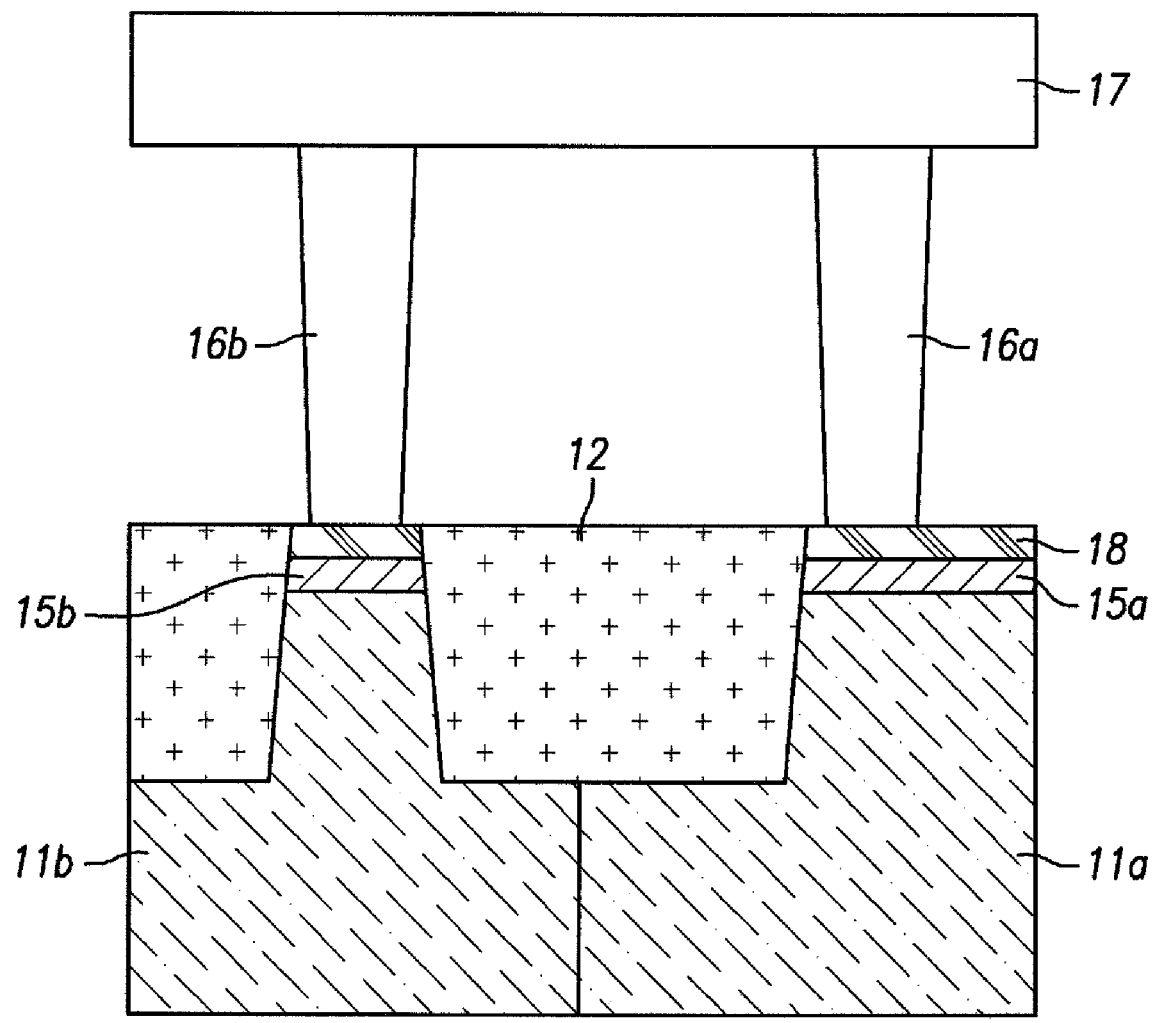
FIG. 2 is an example sectional view taken along the line A-A of FIG. 1.
Figure 3:
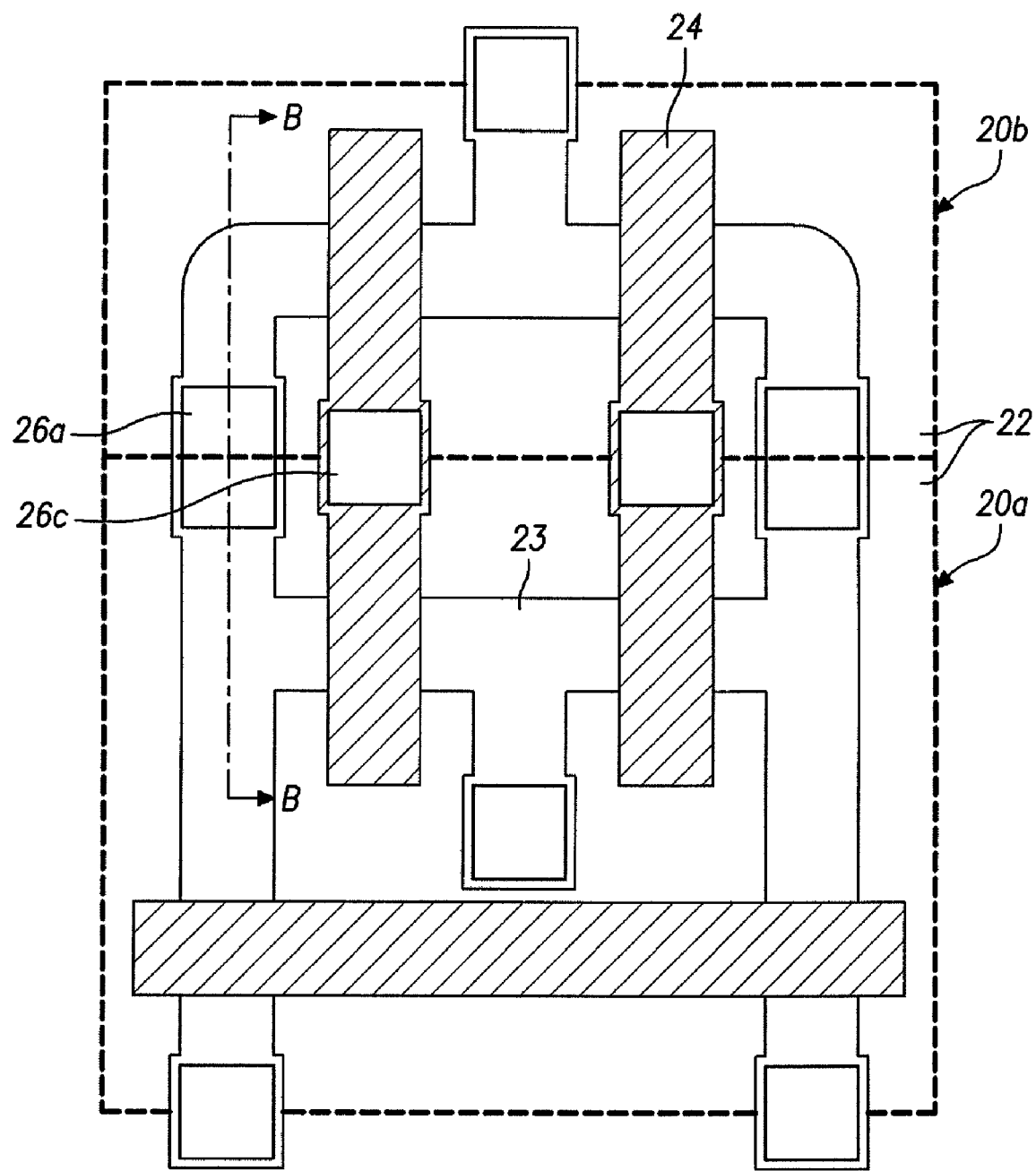
FIG. 3 is an example diagram illustrating a cell layout of an SRAM device according to embodiments.
Figure 4:
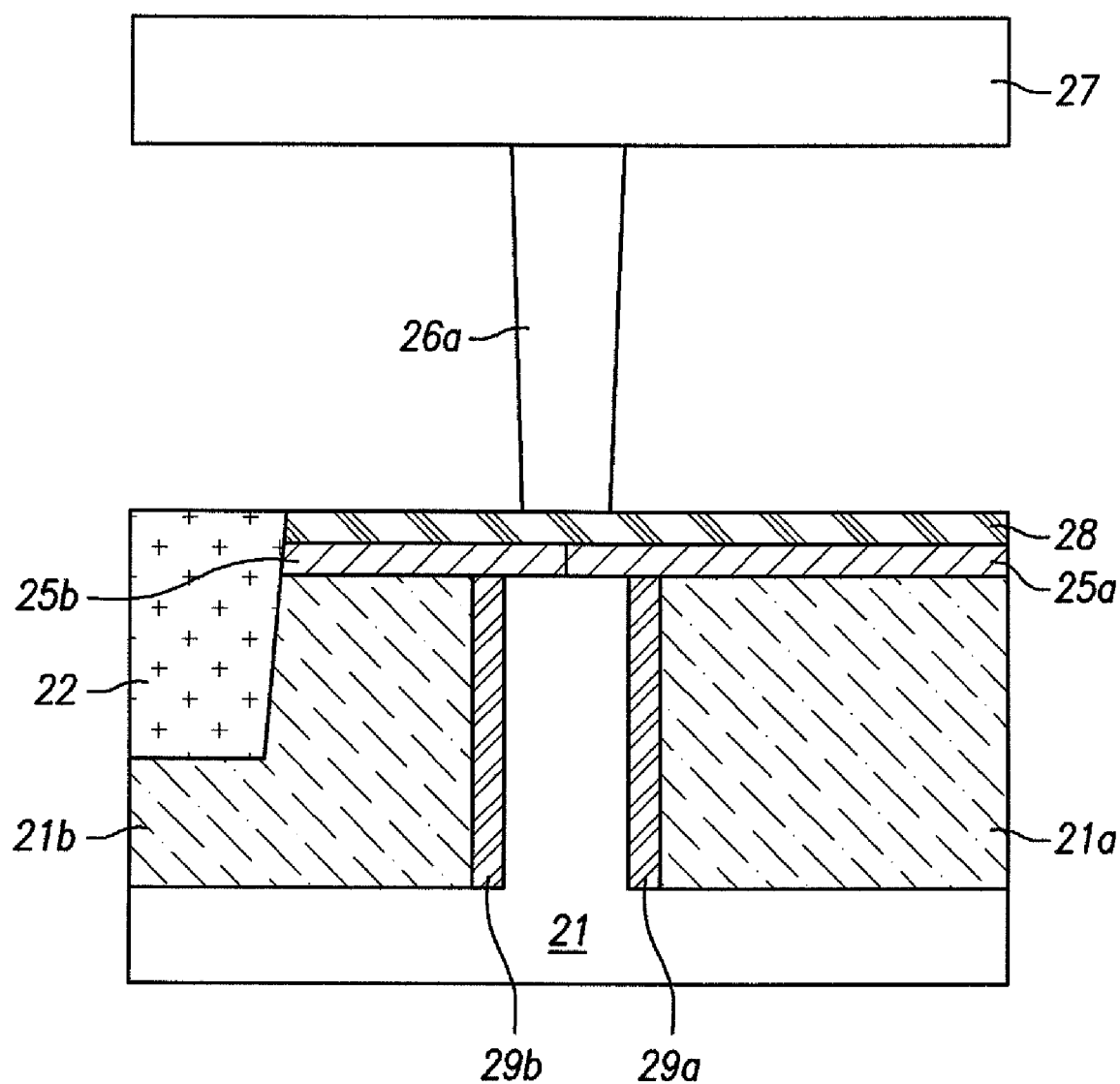
FIG. 4 is an example sectional view taken along the line B-B of FIG. 3.

Referring to FIGS. 3 and 4, N-well 21a and P-well 21b may be formed in silicon substrate 21, and may form pull-down NMOS transistor 20a and pull-up PMOS transistor 20b. Also, device isolation layer 22 may be formed on silicon substrate 21, for example using a shallow trench isolation (STI) method. Active region 23 may be defined by device isolation layer 22. Gate 24 may be formed to cross active region 23 on silicon substrate 21. Source/drain 25a/25b may be formed in active regions 23 on both sides of gate 24. Source/drain 25a/25b and gate 24 may be connected to a metal connection thereon through contacts 26a and 26c and silicide layers may be formed on the source/drain 25a/25b and gate 24.

In embodiments, a SRAM device may not have a wide device isolation layer. In addition, a well isolation method may be applied, and active regions 23 of NMOS 20a and PMOS 20b may be connected to each other. Therefore, contacts may be positioned at wide portions of active regions 23, and not at both ends or in a bent part of active regions 23. Hence, it may be possible to secure the process margins of the active regions and the contacts and to improve electrical characteristics such as leakage current and standby current. This may improve the yield of the SRAM device.

N-well 21a and P-well 21b may be separated from each other by a prescribed distance and well walls 29a and 29b of opposite conductive types may be formed on facing sides. Well walls 29a and 29b may be for preventing short between N-well 21a of the NMOS and N-type drain 25b of the PMOS and short between P-well 21b of the PMOS and P-type source 25a of the NMOS. A distance between wells 21a and 21b may be defined to correspond to the width of the related art device isolation layer, however, may be defined in accordance with the characteristic of the device if necessary.

The contact of PMOS drain 25b and the contact of NMOS source 25a may be united to one common contact 26a and the drain of the PMOS and the source of the NMOS may simultaneously be operated using common contact 26a. A size of common contact 26a may be defined in accordance with the characteristics of the device in the range of one to two times the size of the contact defined by the design rule.

According to embodiments, if active regions 23 of NMOS 20a and PMOS 20b are connected to each other and contacts 26a of the PMOS drain 25b and NMOS source 25a are united into one, it may not be necessary to make active regions 23 having sharp corners. Therefore, bent/corner portions of active regions 23 may be formed to be rounded. This may release the concentration of stress and may prevent the dislocation of active region 23. Also, the sequential heat treatment process may be omitted to simplify processes and to reduce manufacturing cost.

Figure 5:
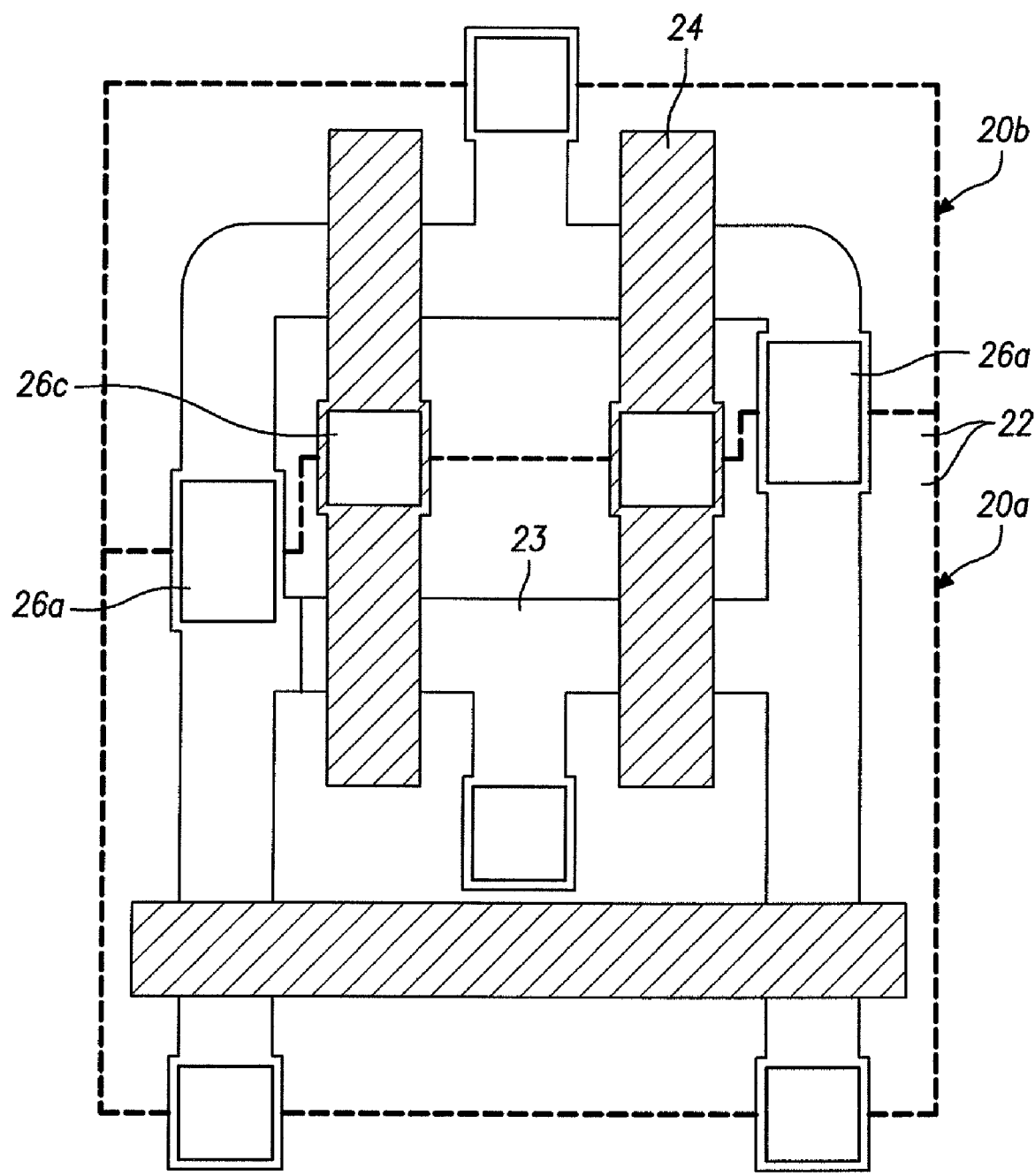
FIG. 5 is an example diagram illustrating a cell layout of an SRAM device according to embodiments.

FIG. 5 is an example cell layout schematic diagram of an SRAM device according to embodiments.

Referring to FIG. 5, to secure additional process margin, two common contacts 26a may be arranged to be asymmetrical with each other. According to such a structure, it may be possible to additionally secure contact process margin in an SRAM design where a unit cell is repeatedly drawn.

According to embodiments, in a SRAM device, the active regions of the NMOS and the PMOS may be connected to each other and the contacts of the PMOS drain and the NMOS source may be united to one. Accordingly, it may be possible to move the contact to the active regions of the wide parts and to improve the sharp shapes of the active regions. Also, the common contacts may be arranged to be asymmetrical with each other.

According to embodiments, it may be possible to secure the process margins of the active regions and the contacts, to improve the electrical characteristics such as the leakage current and the standby current, and to improve the yield of the SRAM device. Also, it may be possible to prevent the dislocation of the active regions and to omit the related art heat treatment process so that it may be possible to simplify the processes and to reduce the manufacturing cost.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. An SRAM device, comprising:
   first and second wells formed in a silicon substrate, the substrate having a first transistor and a second transistor;
   a device isolation layer formed in the silicon substrate to define an active region;
   a gate formed over the silicon substrate and configured to cross the active region; and
   source/drain regions formed in the active regions at sides of the gate,
   wherein the active region of the first transistor is electrically connected to the active region of the second transistor; and
   wherein the first well and the second well have well walls of opposite conductive types on facing sides.

2. The device of claim 1, wherein a drain of the second transistor and a source of the first transistor are connected to a common contact and a source of the second transistor and a drain of the first transistor are connected to another common contact.

3. The device of claim 2, wherein the common contacts are arranged to be asymmetrical with each other.

4. The device of claim 2, further comprising contacts configured to be in electrical contact with the source/drain and the gate.

5. The device of claim 2, were the first well comprises an N-well and the second well comprises a P-well.

6. The device of claim 2, wherein the first transistor comprises an NMOS transistor and the second transistor comprises a PMOS transistor.

7. The device of claim 1, wherein the first well and the second well are separated from each other by a prescribed distance.

8. The device of claim 1, wherein a corner section of the active region is substantially rounded.

* * * * *